US010709023B2

(12) United States Patent
Weidinger et al.

(10) Patent No.: US 10,709,023 B2
(45) Date of Patent: Jul. 7, 2020

(54) PLACEMENT OF COMPONENT IN CIRCUIT BOARD INTERMEDIATE PRODUCT BY FLOWABLE ADHESIVE LAYER ON CARRIER SUBSTRATE

(71) Applicant: AT & S Austria Technologie & Systemtechnik Aktiengesellschaft, Leoben (AT)

(72) Inventors: Gerald Weidinger, Leoben (AT); Timo Schwarz, St. Michael i.O. (AT); Andreas Zluc, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 389 days.

(21) Appl. No.: 15/301,371

(22) PCT Filed: Apr. 1, 2015

(86) PCT No.: PCT/EP2015/057216
§ 371 (c)(1),
(2) Date: Sep. 30, 2016

(87) PCT Pub. No.: WO2015/150474
PCT Pub. Date: Oct. 8, 2015

(65) Prior Publication Data
US 2017/0181293 A1 Jun. 22, 2017

(30) Foreign Application Priority Data
Apr. 2, 2014 (GB) .................. 1405970.3

(51) Int. Cl.
| H05K 3/30 | (2006.01) |
| H05K 1/18 | (2006.01) |
| H01L 23/00 | (2006.01) |
| H05K 3/00 | (2006.01) |
| H05K 3/46 | (2006.01) |
| H01L 21/56 | (2006.01) |
| H05K 3/10 | (2006.01) |

(52) U.S. Cl.
CPC ............... *H05K 3/30* (2013.01); *H01L 24/20* (2013.01); *H05K 1/185* (2013.01); *H05K 3/007* (2013.01);
(Continued)

(58) Field of Classification Search
CPC ......... H01L 21/568; H01L 2224/04105; H01L 2224/18; H01L 2224/73267; H01L 24/19;
(Continued)

(56) References Cited

U.S. PATENT DOCUMENTS

| 6,180,226 B1 * | 1/2001 | McArdle ............... G03F 7/34 |
| | | 428/332 |
| 6,982,478 B2 * | 1/2006 | Nakamura .......... H01L 25/0657 |
| | | 257/676 |

(Continued)

FOREIGN PATENT DOCUMENTS

| EP | 1 092 739 A1 | 4/2001 |
| EP | 1 188 778 A1 | 3/2002 |

(Continued)

*Primary Examiner* — Minh N Trinh
(74) *Attorney, Agent, or Firm* — Robert A. Blaha; Smith Tempel Blaha LLC

(57) ABSTRACT

A method of manufacturing a circuit board or a circuit board intermediate product, wherein the method comprises providing a carrier structure, applying a layer of flowable low-viscosity adhesive on the carrier structure over a surface area of the carrier structure which is larger than a mounting area in which an electronic component is to be mounted on the carrier structure, and pressing the electronic component into a subsection of the layer of adhesive in the mounting area so that at least part of the electronic component is immersed within the adhesive.

18 Claims, 4 Drawing Sheets

(52) U.S. Cl.
CPC .............. *H05K 3/10* (2013.01); *H01L 21/568* (2013.01); *H01L 24/19* (2013.01); *H01L 2224/04105* (2013.01); *H01L 2224/18* (2013.01); *H01L 2224/73267* (2013.01); *H05K 1/188* (2013.01); *H05K 3/4682* (2013.01); *H05K 2201/1003* (2013.01); *H05K 2201/1006* (2013.01); *H05K 2201/10015* (2013.01); *H05K 2201/10151* (2013.01); *H05K 2201/10159* (2013.01); *H05K 2203/0147* (2013.01); *H05K 2203/0156* (2013.01); *H05K 2203/0191* (2013.01); *H05K 2203/0264* (2013.01); *H05K 2203/095* (2013.01)

(58) Field of Classification Search
CPC ............ H01L 24/20; H05K 2201/1003; H05K 2201/1006; H05K 2201/10151; H05K 1/185; H05K 1/188; H05K 2201/10015
See application file for complete search history.

(56) References Cited

U.S. PATENT DOCUMENTS

| | | | | |
|---|---|---|---|---|
| 7,723,838 | B2 * | 5/2010 | Takeuchi | H01L 21/568 257/700 |
| 8,034,658 | B2 * | 10/2011 | Tuominen | H01L 23/5389 438/107 |
| 8,035,217 | B2 * | 10/2011 | Mori | H01L 21/6835 257/690 |
| 9,253,888 | B2 * | 2/2016 | Weidinger | H05K 1/185 |
| 10,085,347 | B2 * | 9/2018 | Tuominen | F02M 53/02 |
| 2002/0029857 | A1 | 3/2002 | Yamada | |
| 2004/0091688 | A1 | 5/2004 | Gaku et al. | |
| 2008/0196930 | A1 * | 8/2008 | Tuominen | H01L 23/5389 174/260 |
| 2009/0020870 | A1 | 1/2009 | Watanabe et al. | |
| 2009/0321965 | A1 | 12/2009 | Watanabe et al. | |
| 2010/0214750 | A1 * | 8/2010 | Tuominen | H01L 23/5389 361/761 |
| 2011/0266039 | A1 | 11/2011 | Tomoda | |
| 2012/0042514 | A1 | 2/2012 | Hauer et al. | |
| 2014/0000941 | A1 | 1/2014 | Weidinger et al. | |
| 2015/0189763 | A1 * | 7/2015 | Schrittwieser | H05K 1/188 361/761 |

FOREIGN PATENT DOCUMENTS

| | | |
|---|---|---|
| EP | 2 421 339 A1 | 2/2012 |
| WO | WO2009138560 A1 | 11/2009 |
| WO | WO2012100274 A1 | 8/2012 |
| WO | WO-2014005167 A1 * | 1/2014 ............. H05K 1/188 |

* cited by examiner

PLACEMENT OF COMPONENT IN CIRCUIT BOARD INTERMEDIATE PRODUCT BY FLOWABLE ADHESIVE LAYER ON CARRIER SUBSTRATE

CROSS-REFERENCE TO RELATED APPLICATIONS

This application is a U.S. national phase patent application of PCT/EP2015/057216 and claims the benefit of the filing date of Great Britain Patent Application No. GB 1405970.3, filed on Apr. 2, 2014, the disclosures of which are hereby incorporated herein by reference in their entirety.

TECHNICAL FIELD

The invention relates to a method of manufacturing a circuit board or a circuit board intermediate product.

Moreover, the invention relates to a circuit board.

TECHNOLOGICAL BACKGROUND

In the context of growing product functionalities of devices equipped with electronic components and increasing miniaturization of such electronic components as well as a rising number of electronic components to be mounted on printed circuit boards, increasingly more powerful field- or array-like components or packages having several electronic components are being employed, which have a plurality of contacts or connections, with ever smaller spacing between these contacts. The fixation or connection of such components increasingly requires the use of highly routed printed circuit boards, wherein it is conceivable that simultaneous reduction of the product size and of the components and printed circuit boards to be used, both with regard to the thickness and the area of such elements, will entail that mounting or arranging such electronic components by way of the required plurality of contact points on the printed circuit boards will become problematic or reach the boundaries of the possible resolution of such contact points.

Background art is disclosed in EP 1,092,739, EP 1,188,778 and US 2004/091688.

US 2014/000941 discloses a method for integrating at least one electronic component into a printed circuit board or a printed circuit board intermediate product, wherein the following steps are provided: providing a layer for at least temporarily supporting the electronic component, fixing the electronic component on the layer, arranging a conductive layer on the supporting layer with at least one cutout corresponding to the dimensions of the electronic component to be fixed, at least partly encapsulating or covering the component fixed on the supporting layer with an insulating material, exposing the electronic component, and at least partial regions of the conductive layer, which adjoins the component and is arranged on the supporting layer, and at least partly making contact between the electronic component and the conductive layer adjoining the component. Furthermore, a printed circuit board and a printed circuit board intermediate product having an integrated electronic component are provided.

Conventionally, temporary adhesive foils are used for temporarily mounting electronic components thereon during the manufacture of a printed circuit board. However, it is conventionally difficult to detach or to remove such an adhesive foil after an interference fit assembly during which pressure is applied for the formation of the printed circuit board constituted by a number of stacked constituents.

However, there is still a need for a proper way of ensuring that an electronic component is placed accurately on a carrier structure in the context of embedding the electronic component in a printed circuit board or a printed circuit board intermediate product.

SUMMARY

There may be a need to provide a circuit board or circuit board intermediate product with an accurately placed electronic component.

This need is satisfied by a method of manufacturing a circuit board or a circuit board intermediate product, and a circuit board according to the independent claims. Further example embodiments are defined in the dependent claims.

According to an exemplary embodiment of the invention, a method of manufacturing a circuit board (in particular a printed circuit board) or a circuit board intermediate product (in particular a printed circuit board intermediate product) is provided, wherein the method comprises providing a carrier structure, applying a layer of flowable adhesive (in particular a low-viscosity resin in a liquid state) on the carrier structure over a surface area of the carrier structure which is larger than a mounting area (in particular an area which may correspond to a main surface of an electronic component) in which an electronic component is to be mounted on the carrier structure, and pressing the electronic component into a subsection of the layer of adhesive in the mounting area so that at least part or at least a portion of (for instance at least one contact pad) of the electronic component is immersed within (i.e. is located within) the adhesive.

According to another exemplary embodiment of the invention, a circuit board, in particular a printed circuit board (PCB), is provided which is manufactured according to a method having the above-mentioned features.

EXEMPLARY EMBODIMENTS

In the context of the present application, a "circuit board" may denote a particularly plate shaped body which has an electrically insulating core and electrically conductive structures on at least one surface of the circuit board. Such a circuit board may serve as a basis for mounting electronic members thereon and/or therein and serves both as a mechanical support platform and an electrically wiring arrangement.

In the context of the present application, a "circuit board intermediate product" may denote a structure obtained during manufacture of a circuit board but not necessarily yet having each and every feature of the final circuit board. Thus, a circuit board intermediate product may be a semi-finished product or pre-form of a circuit board which is to be manufactured based on the circuit board intermediate product.

In the context of the present application, a "printed circuit board" (PCB) may denote a board of an electrically insulating core covered with electrically conductive material and conventionally serving for mounting thereon one or more electronic members (such as packaged electronic chips, sockets, etc.) to be electrically coupled by the electrically conductive material. More specifically, a PCB may mechanically support and electrically connect electronic components using conductive tracks, pads and other features etched from metal structures such as copper sheets laminated onto an electrically non-conductive substrate. PCBs can be single sided (i.e. may have only one of its main surfaces covered by a, in particular patterned, metal layer), double sided (i.e., may have both of its two opposing main surfaces covered by a, in particular patterned, metal layer) or of multi-layer type (i.e. having also one or more, in particular patterned, metal layers in its interior). Conductors on different layers may be connected to one another with plated-through holes which may be denoted as vias. PCBs may also contain one or more electronic components, such as capacitors, resistors or active devices, embedded in the electrically insulating core.

In the context of the present application, a "flowable adhesive" may denote an adhesive (in particular a sticky resin) material in a liquid phase with a sufficiently low viscosity that the adhesive material flows, upon being applied to a surface of the carrier structure, onto a surface area of the carrier structure which is substantially larger than a mounting area of an electronic component to be mounted thereon. Thus, applying the flowable low viscosity adhesive onto the carrier structure will result, due to the flowable character and low viscous property of the adhesive, in the formation of a homogeneous, in particular continuous or uninterrupted, layer (which in particular may have a substantially uniform thickness) on the surface area of the carrier structure. In particular, the surface area of the carrier structure covered with the flowable adhesive may correspond to a substantially an entire main surface of a sheet-like or plate-like carrier structure. More particularly, one entire main surface of such a carrier structure, with the exception of a small circumferential exterior rim only, may be covered with the homogeneous layer of adhesive prior to pressing the electronic component into a relatively small subsection of the layer.

In the context of the present application, the term "part of the electronic component is immersed within the adhesive" may denote that the electronic component is not only attached with its lower surface onto an upper surface of the adhesive but is in contrast to this moved or advanced forwardly into the adhesive material so that also a part (but usually not the entire) lateral surface, not only a lower surface portion, of the electronic component is located within the adhesive and covered by the adhesive. However, the upper main surface of the electronic component usually remains free or uncovered of the adhesive.

According to an exemplary embodiment, the embedded mounting of an electronic component within a circuit board to be manufactured may be rendered highly accurate by forming a homogeneous layer of sticky flowable low viscous adhesive (such as a bonding agent) and by subsequently pushing the electronic component(s) to be mounted into the adhesive. As a result of the low viscosity and the substantially liquid character of the (not yet solidified or hardened or cured) adhesive the electronic component can be easily assembled at a desired position without the need to apply an extensively high pressure. The physical and chemical properties of the flowable adhesive layer will allow to immerse the electronic component quite deeply into the liquid adhesive with moderate pressure so that the front surface of electronic component can extend almost up to a surface of the carrier structure serving as stop barrier, i.e. basically through the entire adhesive layer. Hence, the placement procedure may focus on the correct positioning of the electronic component on the adhesive-covered carrier structure without the need to precisely align a small spot of adhesive relative to the electronic component. Since the flowable adhesive with its low viscosity will not apply a significant counterforce or resistance against the penetration of the electronic component into the adhesive, alignment inaccuracies due to the mounting procedure itself can be strongly suppressed. Consequently, not only the precision of mounting the electronic component at the correct position can be significantly improved, but the deeply immersed main surface of the electronic component (which may for instance carry one or more contact pads and/or a sensor active surface) may extend up to or almost up to the carrier structure. Consequently, after solidifying and removing at least part of the (e.g. the entire) carrier structure, the previously immersed main surface of the electronic component is (at least almost) exposed to a surface of the manufactured circuit board or circuit board intermediate product. This may have advantages for certain applications, for instance when the electronic component is configured for a surface sensing task during normal operation of the circuit board or when an electric connection of the surface to an electronic periphery is desired. According to an embodiment, the carrier structure is a flexible carrier structure.

In the following, further exemplary embodiments of the method and the circuit board will be explained.

In an embodiment, an area of the layer is at least approximately two times, in particular at least approximately five times, of the mounting surface of the electronic component. Thus, even before pressure-based mounting of the electronic component, the adhesive covered surface of the carrier structure significantly exceeds the mounting surface of the electronic component so that no specific care needs to be taken to precisely align a small spot of adhesive relative to the mounting surface of the electronic component. In a preferred embodiment, substantially the entire surface of the carrier structure which may correspond to a main surface of the circuit board to be manufactured may be covered with the adhesive layer.

In an embodiment, the electronic component is pressed into the adhesive substantially up to the surface of the carrier structure covered with the adhesive. This forms the basis for later using an exposed surface of the electronic component (for instance with pad or pads, or with a surface sensor) of the circuit board to be manufactured for an exposed surface task, for instance a corresponding sensing task or for electrically contacting. After removing the carrier structure at least from the mentioned surface of the electronic component only a very simple exposing procedure (for instance a cleaning procedure or an etching procedure) is sufficient, or no exposing procedure at all is required for exposing the mentioned surface portion of the electronic component.

In an embodiment, the at least one embedded component comprises at least one active electric component and/or at least one passive electric component. Examples of the embedded components are a data storage memory such as a DRAM (or any other memory), a filter (which may for instance be configured as a high pass filter, a low pass filter or a bandpass filter, and which may for instance serve for frequency filtering), an integrated circuit (such as a logic IC), a signal processing component (such as a microprocessor), a power management component, an optical electrically interfacing member (for instance an optoelectronic member), a voltage converter (such as a DC/DC converter or an AC/DC converter), a cryptographic component, a capacitor, an inductance, a switch (for instance a transistor-based switch) and a combination of these and other functional electronic members.

In an embodiment, the electronic component is a sensor, in particular a sensor having the task of sensing a physical and/or a chemical and/or a biological parameter at an exposed surface under normal operation of the circuit board. Thus, for this embodiment of the electronic component, it is of significant advantage that, as a consequence of the mounting procedure of the electronic component by immersing it in the flowable low viscosity adhesive layer up to or almost up to an adhesive covered surface of the carrier structure, a main surface of the electronic component including a sensor active surface already extends substantially up to an exposed surface after removal of at least the portion of the carrier structure covering the main surface. Examples for such sensors are chemical sensors, biological sensors, pressure sensors, fingerprint sensors, capacitive or resistive touch sensors, electromagnetic radiation sensors, etc.

In an embodiment, a viscosity of the adhesive when applied on the carrier structure is in a range between approximately 1000 mPa·s and approximately 50000 mPa·s at 25° C., in particular in a range between approximately 5000 mPa·s and approximately 25000 mPa·s at 25° C. Hence, the adhesive may be a low-viscosity adhesive under processing conditions. This ensures that the adhesive is flowable when applied on the carrier substrate and forms a continuous and substantially homogeneous adhesive layer. Furthermore, this ensures that the electronic component can be pressed into a low viscous adhesive layer with a low pressing force. Too small values of the viscosity of the adhesive when applied on the carrier structure may result in problems with the wettability of the adhesive, so that the adhesive may tend to form droplets rather than a layer. Too large values of the viscosity of the adhesive when applied on the carrier structure may reduce the range of usable application methods, such as spraying and roller coating. After air contact for a sufficient period of time, the viscosity of the adhesive will increase significantly.

In an embodiment, the adhesive comprises or consists of resin, in particular epoxy resin. Epoxy resins, also known as polyepoxides are a class of reactive prepolymers and polymers which contain epoxide groups. Epoxy resins may be reacted (cross-linked) with themselves through catalytic homopolymerisation, or with a wide range of co-reactants including polyfunctional amines, acids (and acid anhydrides), phenols, alcohols, and thiols. These co-reactants are often referred to as hardeners or curatives, and the cross-linking reaction is commonly referred to as curing.

In an embodiment, the adhesive is applied to the carrier structure by at least one of the group consisting of spraying, roller coating, printing, and a wiper treatment. In view of the flowable property of the resin at processing temperature, it may be applied onto the carrier structure with a large variety of methods and forms a homogeneous layer even without the specific treatment.

In an embodiment, the method further comprises solidifying or curing the adhesive after having mounted the electronic component. For instance solidification of a resin layer as adhesive material may be triggered by heat, for instance starting cross-linking reactions of constituents of the resin.

In an embodiment, the method further comprises removing (for instance peeling off) at least part of the carrier structure after solidifying or curing the adhesive. In one alternative, in which the carrier structure may be denoted as a temporary carrier structure, the entire carrier structure may be removed from the adhesive-electronic component-arrangement. In other alternatives, only part of the carrier structure is removed from the adhesive electronic component-arrangement (for instance one of several layers of a multi-layer carrier structure), and another part of the carrier structure (for instance one of the several layers) remains integrated with the adhesive-electronic component-arrangement. Removing at least part of the carrier structure after solidification of the resin allows to prevent handling of thin bodies before solidifying the resin, since the (at least partially temporary) carrier structure may support the thin bodies during processing and handling. At the same time, removing at least part of the carrier structure after solidification of the previously flowable liquid allows to obtain a compact adhesive-component arrangement in accordance with the ongoing trend of miniaturization of circuit boards.

In an embodiment, the method further comprises at least partially exposing the part of the electronic component immersed within the adhesive by removing remaining material of the layer of adhesive covering the immersed part of the electronic component after removing at least part of the carrier structure. Such a procedure may be accomplished for example by combined lithography and etching, by laser grooving, or by a mechanical abrasion procedure. Such procedures are very simple and can be carried out in a short time, since the flowable and low viscosity resin allows to press the electronic component almost up to the carrier structure. Hence, it is in many cases sufficient to almost only clean the surface of the adhesive-electronic component-arrangement to expose the previously immersed main surface of the electronic component. This may be advantageous to couple one or more contact pad(s) of the electronic component electrically to other electrically conductive structures, or to expose sensor active surface portions of the electronic component for sensing purposes or the like.

In an embodiment, the method further comprises forming (for instance by deposition or layer connection, for instance by lamination) electrically conductive material at least on the at least partially exposed part of the electronic component, in particular on an exposed at least one contact pad. By taking this measure, it is possible to electrically connect the contact pad(s) at a main surface of the electronic component to other electronic members and/or to form signal and/or supply lines for the electronic component.

In an embodiment, the method further comprises forming an electrically insulating structure on the adhesive and the electronic component. When attaching the electrically insulating structure (such as a prepreg sheet) to the cured adhesive-component arrangement, formation of an electrically insulating core of the circuit board may be completed.

In an embodiment, the electrically insulating structure is at least partially formed of resin, in particular of the same resin material used for the adhesive layer applied on the carrier structure. By using the same resin material for the adhesive layer applied to the carrier structure and for the electrically insulating structure, the number of material bridges in the circuit board to be formed may be rendered very small. Additionally, the thermal expansion properties of the two kind of resins are then the same, thereby allowing to use the manufactured circuit board over a broad temperature range without the danger of formation of high mechanical tensions as a result of a thermal expansion.

In an embodiment, the method further comprises forming at least one electrically conductive structure on and/or in the electrically insulating structure. For instance, an electrically conductive layer (such as a metal layer, more particularly a copper layer) may be formed on one or both opposing main surfaces of an arrangement of the solidified adhesive layer with the immersed electronic component and the electrically insulating structure to thereby complete formation of the circuit board. The electrically conductive layer(s) may be patterned in accordance with a desired wiring scheme.

In an embodiment, the electrically insulating structure comprises a recess (such as a blind hole or a through hole) at the position of the mounted component. For instance, the electrically insulating structure may be a recessed plate or foil having its recess at a position and with a dimension corresponding to and for accommodating the electronic component to be mounted within the circuit board to be manufactured.

In an embodiment, the electrically insulating structure is formed at least partially from prepreg material. Such prepreg material may form at least partially an electrically insulating core of a glass fiber reinforced epoxy-based resin and may be shaped as a plate or sheet. Prepreg may be denoted as a glass fiber mat soaked by resin material and being used for an interference fit assembly for the manufacture of printed circuit boards.

In an embodiment, the electronic component is pressed into the adhesive layer so that at least one contact pad of the electronic component is immersed within the adhesive. The at least one contact pad may then extend almost up to the surface of the carrier structure covered with the adhesive under displacement of adhesive so that, after removing the carrier structure, the at least one contact pad may be already exposed or almost exposed to a back surface of the circuit board intermediate product so as to be electrically connectable with reasonable effort.

In another embodiment, the electronic component is pressed into the adhesive so that at least one sensor active surface (i.e. a surface portion at which a sensor event results in the generation of a detectable signal) of the electronic component is immersed within the adhesive. The at least one sensor active surface may then extend almost up to the surface of the carrier structure covered with the adhesive under displacement of adhesive so that, after removing the carrier structure, the at least one sensor active surface may be already exposed or almost exposed to a back surface of the circuit board intermediate product so as to be ready to be used for sensing tasks.

In an embodiment, the carrier structure is a foil, in particular a plastic foil, more particularly a plastic foil comprising at least one of polyolefine, polyimide, polyethylene, polytetrafluoroethylene (PTFE), polyvinylidine fluoride (PVDF) and a waxed foil. Such a foil may serve as a cheap temporary carrier which can be easily removed (in particular by peeling it off) after solidification of the adhesive and which can be handled properly even in case of very thin layers to be formed and in case of large circuit boards to be manufactured. Advantageously, such a plastic foil (for instance from polyolefine) may be covered with a lubricant or anti-friction agent for promoting later detachability of the plastic foil from an interference fit assembly, i.e. after having pressed multiple constituents (including the solidified adhesive and the electronic component) of the circuit board together. A foil may be heterogeneous, e.g. may include paper or fibers, e.g. for reinforcing the foil.

In a highly preferred embodiment, the method further comprises surface activating the surface of the foil on which the adhesive is to be applied prior to applying the adhesive on the surface. Although a plastic foil is as such a proper choice for a temporary carrier for formation of the circuit boards, it may happen with many kinds of adhesives, in particular resin, that the adhesive does not form a homogeneous layer on such a plastic foil buts in contrast to this tends to forms separate droplets on the foil. The formation of droplets however renders the mounting of components in an accurate manner impossible. The present inventors have surprisingly recognized that the formation of droplets of adhesive on a plastic foil can be efficiently suppressed and the formation of a homogeneous layer of adhesive may be promoted by subjecting the plastic foil, prior to the application of the flowable adhesive, to a surface activation procedure. One example for such a surface activation includes surface functionalization, such as the deposition of a certain functionalization material on the plastic foil. In another example, such a surface activation may however be accomplished by a mere surface treatment of the foil without the deposition of material.

In an embodiment, the surface activating comprises at least one of the group consisting of a plasma treatment, a corona treatment, and a flame impingement.

Surface activating a plastic foil as temporary carrier structure for the formation of the circuit board has turned out to work particularly well upon treating the surface to be applied with adhesive (such as a resin-based adhesive) with a plasma. For instance, one or more (for instance four) plasma nozzles which may be arranged on a movable arm or the like may be guided along a predefined trajectory (for instance an S-shaped curve) along the surface of the carrier structure to be activated. It is however also possible to mount the carrier structure to be activated in a plasma chamber where the carrier structure is exerted to a plasma of the surrounding atmosphere. The used plasma may hence be an atmospheric plasma. The used plasma can also be a plasma in a PECVD (plasma enhanced chemical vapor deposition) chamber.

Alternatively, a corona treatment may be performed which can be realized by subjecting the surface of the carrier structure (such as a plastic foil) to an appropriate electric field. When the plastic foil is placed in an electrically charged chamber, spark discharge events may occurs on the plastic foil, thereby promoting subsequent coatability of the surface activated plastic foil.

Further alternatively, a flame impingement or flame treatment of the surface of the plastic foil can be carried out. In such an embodiment, surface activation of the foil for promoting adhesion of flowable adhesive can be achieved by directing a flame onto the surface of the plastic foil, thereby also activating the latter to prepare it for a subsequent deposition of flowable low viscosity (in particular resin-based) adhesive.

Although the preceding description of surface activation focuses on foils, in particular plastic foils, as carrier substrates, in which surface activation is particularly appropriate in terms of promoting adhesion of an applied adhesive layer, it should be said that surface activation may also be advantageous when using other carrier substrates such as metal based foils or layer stacks of metallic and/or plastic material(s).

In an embodiment, the foil is made of a hydrophobic material. This simplifies later removal of the foil from an interference fit assembly (at least including solidified adhesive and the electronic component immersed therein) and still allows for the formation of a homogeneous adhesive layer on the surface of the foil, in particular after surface-activation.

In an embodiment, the method further comprises removing in particular peeling off, the entire foil after solidifying the adhesive. Since a plastic foil is flexible and elastic, it is possible without taking any further measures to simply strip off or peel-off the plastic foil from the solidified adhesive. It may be possible to separate the foil from the rest of the circuit board to be manufactured without any portions of the for instance resin-based adhesive remaining at the foil. Therefore, a smooth surface of the arrangement of cured adhesive and embedded electronic component can be achieved which simplifies further processing.

In an embodiment, a thickness of the foil is in a range between approximately 50 µm and approximately 500 µm, in particular between approximately 100 µm and approximately 300 µm. For example, a plastic foil having a thickness of about 200 µm has turned out to be advantageous, since this provides a stable and bending-free support for the adhesive and can provide at the same time a sufficient flexibility to allow the foil to be stripped off without exerting excessive forces onto the solidified adhesive.

In an embodiment, the carrier structure is configured as a layer sequence, i.e. a stack of at least two layers (wherein each layer may for instance be made of a plastic or metallic material). In such a layer stack, each of the layers may be optimized in terms of its specific function, for instance providing mechanical stability or have proper adhesion capabilities for liquid adhesive.

In particular, such a layer sequence may comprise an electrically conductive layer facing the adhesive, a separation layer and a support layer being separable from the electrically conductive layer by separation, in particular by peeling it off, at the separation layer. For example, a layer stack of three individual layers may be used as the carrier structure. The electrically conductive layer which is directly connected to the adhesive may remain part of the readily produced circuit board and may function as or form basis of an electrically conductive contact layer or pattern of the circuit board or circuit board intermediate product. For this purpose, it is possible to use an electrically conductive layer having an extremely small thickness (for instance between 1 µm and 10 µm), while at the same time preventing handling of such thin layers due to the existence of the mechanically robust support layer (which may have a sufficiently large thickness of for instance 30 µm to 100 µm). The separation layer in between the thinner electrically conductive layer and the thicker support layer may have the function to allow separation of the layer stack so that peeling off the support layer at the separation layer is possible without removing the electrically conductive layer from the adhesive.

In an embodiment, the electrically conductive layer is thinner than the support layer, for instance has a thickness in a range between 0.5 µm and 10 µm, in particular between 1 µm and 5 µm. The support layer may for instance have a thickness in a range between 30 µm and 100 µm. Both layers may be made of the same metal.

In an embodiment, the electrically conductive layer comprises or consists of copper. Alternatively, the electrically conductive layer may be made of another electrically conductive metal such as aluminum.

In an embodiment (for instance using the above-mentioned layer sequence or layer stack as carrier structure), the method further comprises removing only part of the carrier structure after solidification of the adhesive so that another part of the carrier structure remains attached to the adhesive. The removed part may temporarily support handling of the for instance very thin material on the carrier structure. The part remaining attached to the adhesive also in the readily manufactured circuit board may provide an electronic function in terms of the circuit board, for instance may be configured as an electric wiring structure. This part of the carrier structure remaining permanently attached to the adhesive may be further processed after removal of the other part, for instance may be patterned by a lithography and etching procedure to adjust its electric properties.

In an embodiment, the method further comprises subsequently removing a portion of the remaining other part and a portion of the adhesive so as to at least partially expose the part of the electronic component immersed within the adhesive. Although contact pad(s), a sensor active surface and/or other functional portions of the electronic component may extend almost up to the adhesive covered surface of the carrier structure by pressing the electronic component deeply into the flowable layer of adhesive, it may still be covered to a slight extent with adhesive material. In order to establish a reliable electric connection between the contact pad(s) and a connected electric component (such as a wiring or a surface mounted component) and/or in order to allow the electronic component to perform a sensor function, exposure of the contact pad may be performed by etching, laser grooving, etc.

In an embodiment, the layer of adhesive may be applied on the carrier substrate with a thickness in a range between 1 µm to 20 µm, in particular in a range between 2 µm and 10 µm. In particular when the layer of adhesive is a continuous layer covering the entire or at least almost the entire (for instance at least 50%, particularly at least 90%) of a main surface of the carrier structure, the mentioned very small thicknesses of the layer of adhesive are sufficient for an accurate placement of one or more electronic components. Such thin thicknesses promote the formation of a homogeneous layer of for instance resin-based adhesive.

In an embodiment, the carrier structure with adhesive layer and mounted electronic component may be covered with at least one electrically conductive structure (for instance a continuous or patterned copper layer) and/or may be covered with at least one electrically insulating structure (for instance a continuous or recessed prepreg layer) and may be then subjected to a pressure pressing these constituents together for the formation of an interference fit assembly. At least part of the carrier structure may then (i.e. after formation of the interference fit assembly) be removed from the rest of interference fit assembly to thereby complete formation of the circuit board (in particular printed circuit board). It is possible to treat the carrier structure with adhesive layer and embedded electronic component in an oven (for instance at a temperature of 50° C. for a duration of 50 minutes) for removing solvent from the layer of adhesive before pressing the constituents together.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DETAILED DESCRIPTION OF ILLUSTRATED EMBODIMENTS

Figure 1:
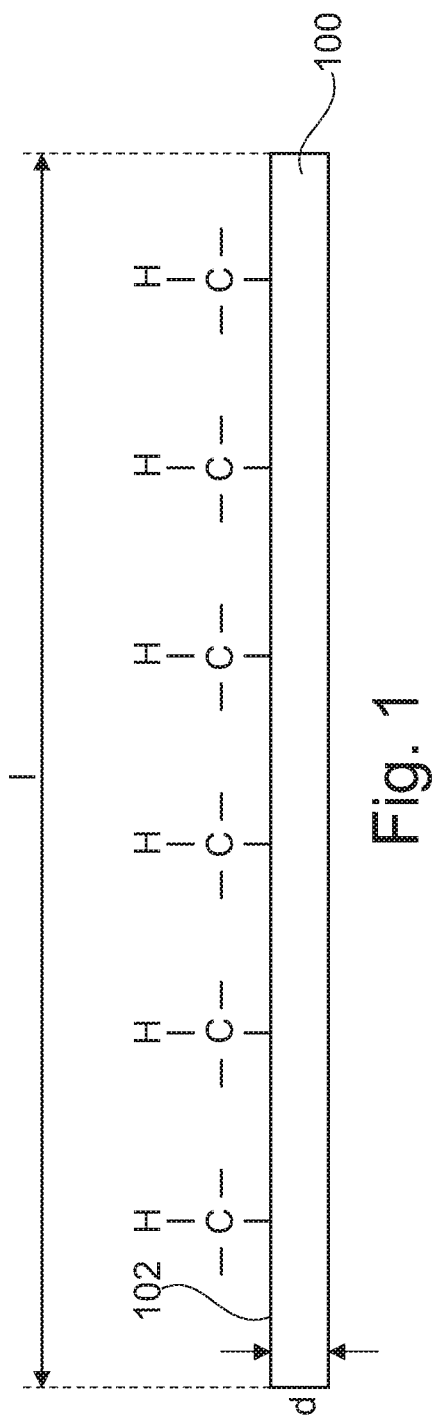
FIG. 1, FIG. 2, FIG. 3, FIG. 4, FIG. 5, FIG. 6, FIG. 7 and FIG. 8 illustrate different structures obtained during carrying out a method of manufacturing a circuit board intermediate structure (see FIG. 4) and a circuit board (see FIG. 6) according to an exemplary embodiment of the invention.

The illustrations in the drawings are schematical. In different drawings, similar or identical elements are provided with the same reference signs.

FIG. 1 to FIG. 8 illustrate different structures obtained during carrying out a method of manufacturing a circuit board intermediate structure 400 (see FIG. 4) and a circuit board 600 (see FIG. 6) according to an exemplary embodiment of the invention.

Before the mentioned embodiment will be described in further detail referring to FIG. 1 to FIG. 8, some general considerations of the present inventors with regard to one aspect of the invention related to this embodiment will be presented.

The present embodiment relates to a method of configuring a temporary auxiliary foil as a support base for a precisely positioned placement of embedded electronic components in printed circuit boards.

Conventionally, such a mounting of an electronic component within a printed circuit board involves the problem of a poor detachability of auxiliary foils of conventional materials. In contrast of this, the described embodiment allows to properly remove an auxiliary foil after use without deterioration or damage of panel or members thereof. The described embodiments in particular allow for a homogeneous coating of a separation foil having liquid repellent properties with a liquid adhesive. Moreover, the described embodiment increases the reliability when using an adhesive having similar properties as those of prepreg resin (in particular in view of reflow stability, passing temperature cycle tests, and passing drop tests).

An exemplary embodiment uses, as an auxiliary means for embedding electronic components in a printed circuit board, detachable adhesive foils which serve for a proper positioning of the electronic components in a surface plane of the adhesive foil (i.e. in an xy plane). These auxiliary foils shall be removable (preferably completely or residue-free) after completion of a pressing procedure during which components of a printed circuit board are connected to one another by pressing them together, wherein the electrically insulating core shall not be damaged during this procedure.

Separation foils used according to exemplary embodiments are not prone to be glued together with other constituents of the circuit board to be manufactured during the pressing procedure, show a proper separation function even at high pressing temperatures and can be removed without residues after the pressing procedure.

The present inventors have first tried to coat such a separation foil with a sticky epoxy-based resin solution. However, it turned out to be very difficult to obtain a homogeneous coating or layer formation on such a separation foil due to the liquid repellent properties of the foil.

The present inventors have then surprisingly recognized that, when the same separation foil is made subject to a plasma treatment with atmospheric plasma, the so-treated surface of the separation foil can be subsequently homogeneously coated with the resin solution under formation of a stable thin layer. Due to the highly sticky property of such a resin solution, it has turned out to be possible to mount the electronic components precisely on the homogeneous layer of resin and to thereby immobilize the electronic component in the xy plane.

The so treated auxiliary foil with one or more electronic components mounted thereon can then be further processed so as to readily manufacture the printed circuit board. For instance, it is possible to press the pre-treated separation foil together with one or more prepreg structures having one or more recesses sized in accordance with a dimension of the one or more electronic components. This allows the formation of at least partially electrically insulating cores with embedded components at the surface, rendering it possible to accommodate for instance sensors or other surface-active elements at a surface of the printed circuit board. By carrying out additional pressing procedures, it is possible to manufacture multiple layer printed circuit boards with embedded components.

Thus, the described embodiment uses an epoxy-based resin solution as flowable adhesive for homogeneously coating a separation foil to obtain a mounting platform for placing electronic components thereon and therein, to thereby manufacture printed circuit boards with one or more embedded components. This can be advantageously combined with a surface activating pre-treatment of the separation foil in order to enable a homogeneous coating of the latter by liquid low viscous adhesive. Such a procedure is particularly appropriate for the formation of printed circuit boards with one or more sensors and/or conductive pads exposed at a surface, and/or for the embedding of (in particularly large-size) components within a printed circuit board.

FIG. 1 shows a cross-sectional view of a sheet-like planar plastic foil (for instance made of polyolefine) used as a starting point for configuring a carrier structure 100. For instance, the carrier structure 100 may have a thickness, d, of 200 μm and may have a length, l, of for instance 5 cm (a width may also be 5 cm, although not shown in FIG. 1). As indicated in FIG. 1, a surface 102 of the carrier structure 100 may be hydrophobic. Therefore, the formation of a planar layer of a resin-based adhesive on the surface 102 is very difficult.

Figure 2:
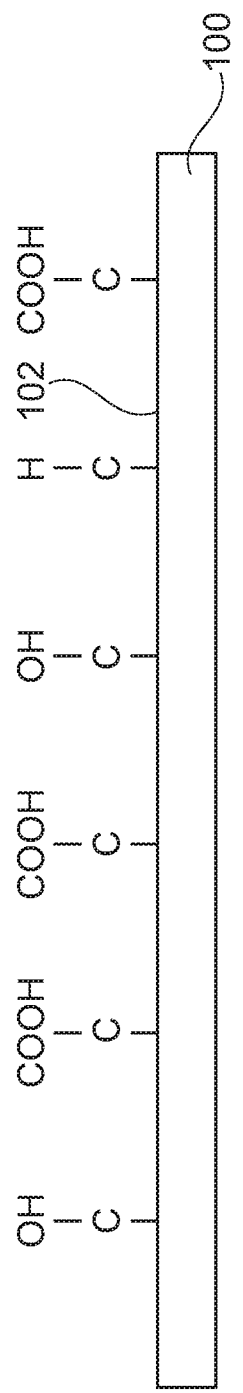

In order to render the carrier structure 100 suitable for the subsequent formation of a thin homogeneous liquid layer of resin on the surface 102, the carrier structure 100 may be made subject to an oxygen plasma treatment, for instance using an atmospheric plasma. The result of this treatment is shown in FIG. 2. Now, the surface 102 has been surface activated by the plasma treatment, i.e. the surface 102 has been chemically modified to promote adhesion of a resin-based adhesive on the activated surface 102.

Figure 3:
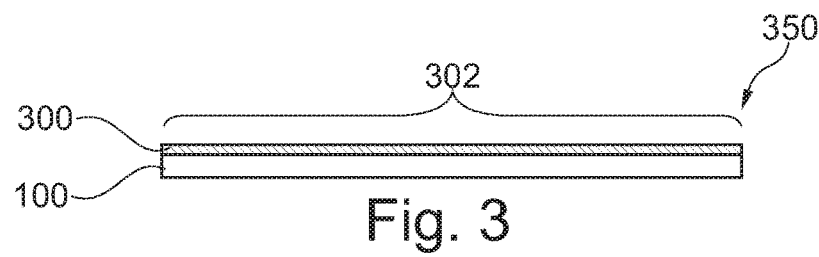

In order to obtain a structure 350 as shown in FIG. 3, a layer of epoxy-based sticky liquid adhesive 300 is applied to the entire activated surface 102, denoted as surface area 302 in FIG. 3. The formation of a homogeneous uniformly thick layer of low viscous flowable adhesive 300 on the activated surface area 302 can be performed by a wiper treatment, spraying, roller coating, printing, etc. The surface area 302 covered with the adhesive 300 is many times larger than a mounting area 402 in which an electronic component 402 is to be mounted on the carrier structure 100 (see FIG. 4). The mounting area 402 equals to a lower main surface of the electronic component 402.

Figure 4:
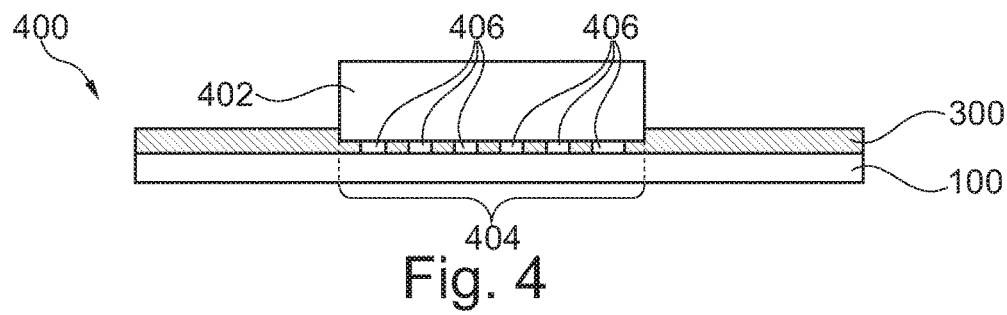

In order to obtain the circuit board intermediate product 400 shown in FIG. 4, the electronic component 402 is pressed into a subsection of the layer of flowable adhesive 300 in the mounting area 404 so that part of the electronic component 402 including a lateral or side surface thereof and contact pads 406 exposed at the lower main surface are immersed within the flowable adhesive 300 which is therefore laterally displaced or pushed aside. A corresponding application of pressure may be performed by an assembly machine handling the electronic component 402. By pressing the electronic component 402 into the layer of adhesive 300, the contact pads 406 extend or at least almost extend up to the surface 102 as a mechanical stop.

Solvent in the layer of adhesive 300 may be removed (for instance by evaporation) from the circuit board intermediate product 400 by increasing the temperature for a given time interval.

Figure 5:
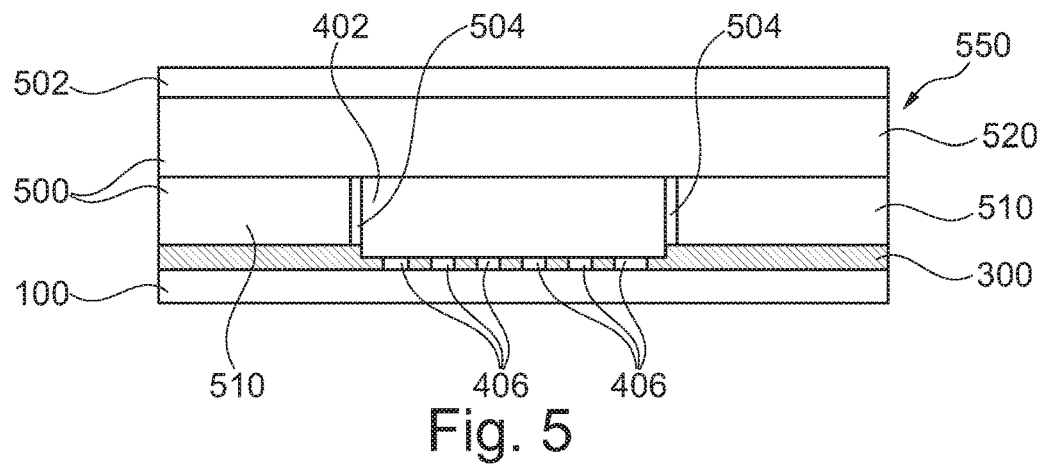

As can be taken from FIG. 5, a structure 550 can be obtained by firstly placing two electrically insulating structures 500 and then an electrically conductive material 502 (here a copper foil) on the circuit board intermediate product 400. The electrically insulating structures 500 comprise a recessed electrically insulating sheet 510 (here made of prepreg material, for instance glass fibers in a resin matrix) which is placed onto the circuit board intermediate product 400 so that the electronic component 402 is located within recess 504. Advantageously, resin material of the recessed electrically insulating sheet 510 and resin material of the resin-based layer of adhesive 300 may be the same. This reduces the number of material bridges in the circuit board 600 to be manufactured. This is also advantageous for instance in terms of the suppression of mechanical tensions resulting from different thermal expansion properties of different materials. In the shown embodiment, a continuous electrically insulating sheet 520 of the electrically insulating structures 500 is placed on top of the recessed electrically insulating sheet 510 and the top main surface of the embedded electronic component 402.

After attaching the electrically conductive material 502 embodied as a copper foil onto the continuous electrically insulating sheet 520, mechanical pressure may then be applied to the structure 550 to compress the various constituents of the structure 550 for the formation of an interference fit assembly by force fitting.

Figure 6:
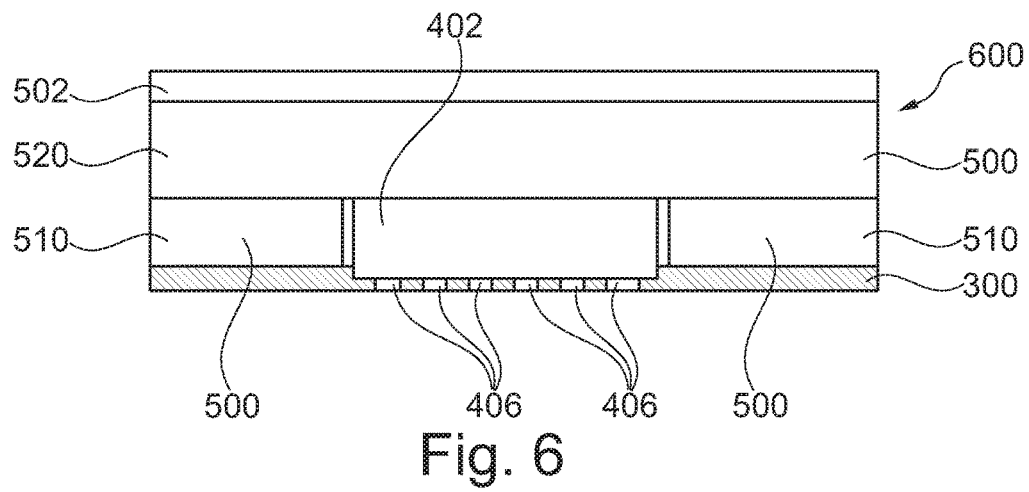

In order to obtain the printed circuit board 600 shown in FIG. 6, the carrier structure 100 may then be detached, for instance peeled off from the rest of the compressed structure 550. No residues of adhesive 300 remain at the removed carrier structure 100.

Due to the described manufacturing procedure, the contact pads 406 of the embedded electronic component 402 may already be free of material of the adhesive 300. However, it is possible to further clean the contact pads 406 to improve their electrically conductive properties and therefore the reliability of the manufactured circuit board 600. This may for instance be done by a plasma treatment of by a laser treatment.

Figure 7:
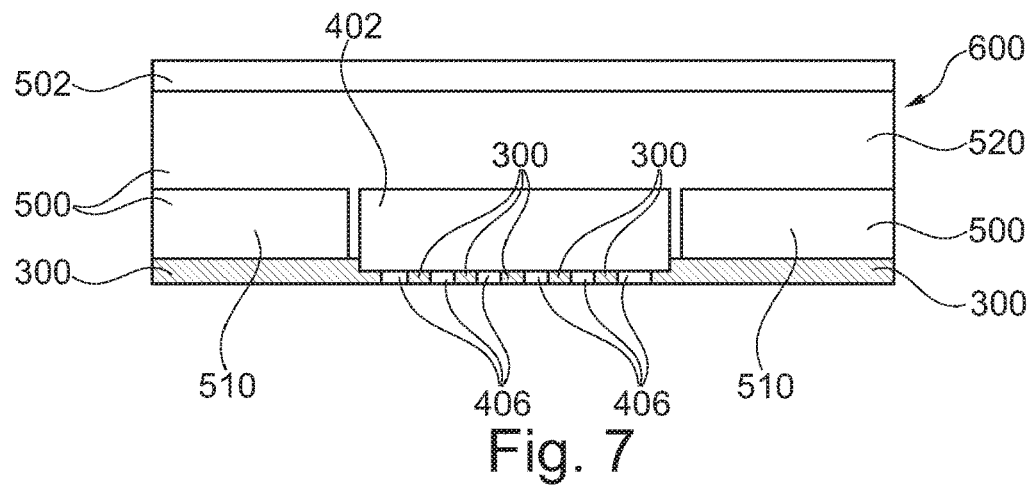

As can be taken from FIG. 7, the printed circuit board 600 may optionally be made subject to further processing. For instance in an embodiment in which the contact pads 406 need to be exposed, it is possible to carry out a lithography and etching procedure to form a larger opening in the solidified adhesive 300. This exposes the lower surface of the contact pads 406 while maintaining adhesive material between the contact pads 406 (this allows the individual contact pads 406 to be contacted individually).

Figure 8:
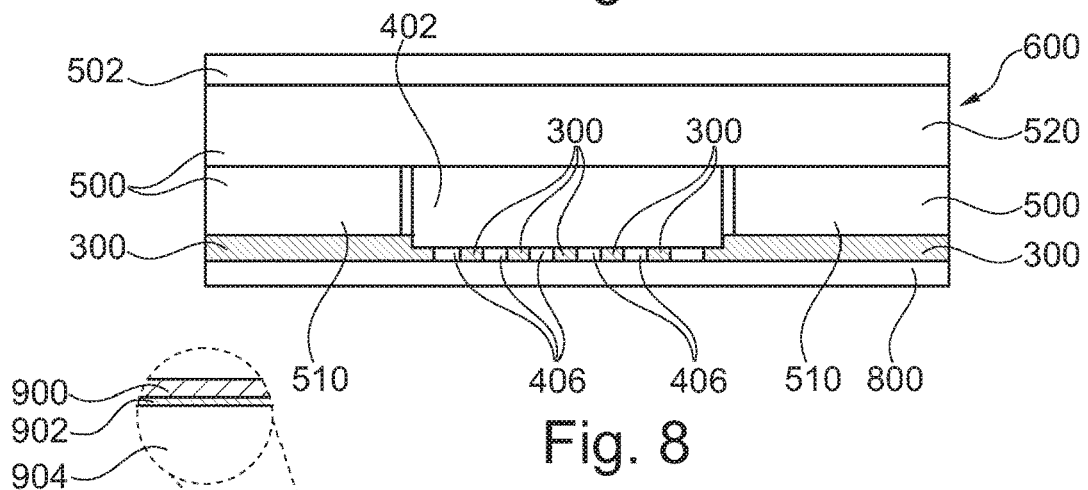

As can be taken from FIG. 8, the printed circuit board 600 of FIG. 7 may also be made subject to a further metallization procedure. In the shown embodiment, an electrically conductive layer 800 is applied to the lower surface of the contact pads 406 and the adhesive material between them for electrically coupling the contact pads 406 to an electronic periphery.

After obtaining the printed circuit board 600 shown in FIG. 8, it is possible to add one or more further layers and processes (for instance drilling access holes and filling them with electrically conductive material), as known by those skilled in the art.

FIG. 9 to FIG. 13 illustrate different structures obtained during carrying out a method of manufacturing a circuit board intermediate structure 400 (see FIG. 11) and a circuit board 600 (see FIG. 13) according to another exemplary embodiment of the invention.

Before the mentioned embodiment will be described in further detail referring to FIG. 9 to FIG. 13, some general considerations of the present inventors with regard to the described further aspect of the invention related to this embodiment will be presented.

According to the presently described embodiment, an assembly or mounting concept for the manufacture of printed circuit boards with embedded components is provided. In contrast to conventional approaches, the embodiment renders it unnecessary to form island-shaped adhesive pads by screenprinting or the like, since a resin-based adhesive may be applied as a full continuous layer by carrying out a coating procedure. Moreover, the described embodiment increases the reliability and quality of a manufactured circuit board when using an adhesive having similar properties as those of prepreg resin of electrically insulating structures forming part of the circuit board to be manufactured (in particular in view of reflow stability, passing temperature cycle tests, and passing drop tests). Furthermore, the use of additives and the like for adhesive modification, for instance for reducing the formation of bubbles or the like, may become dispensable. Moreover, this concept is compatible with the embedding of even large-size components, in particular having a dimension of more than 4×4 $mm^2$.

In a conventional procedure for the manufacture of printed circuit boards with embedded components, individual adhesive pads may be printed by screen printing onto a carrier substrate. With such a procedure, it is necessary to vent the adhesive pads in a vacuum dry chamber in order to remove air bubbles out of the adhesive pads. Then, the electronic components may be mounted by a mounting machine and the adhesive may be completely hardened. Subsequently, the obtained structure may be connected with further constituents by applying pressure.

In contrast to such conventional approaches, the exemplary embodiment presently described coats (at least substantially) the entire surface of a copper foil with a resin solution. The one or more electronic components may be mounted or assembled into the still liquid sticky resin solution. Since the resin solution has a low viscosity, the mounting pressure of the assembly machine allows to form the layer of resin with a very small thickness of for instance 1 µm to 20 µm, in particular 2 µm to 10 µm. Subsequently, the resin solution can be dried, cured or hardened. The arrangement of the cured resin layer with embedded electronic component(s) can subsequently be pressed together with one or more prepreg structures and a copper foil.

Since the resin solution can be configured with a very similar constitution as the resin used for the prepreg (in particular with a high value of the glass transition temperature), a high reliability is achievable (in terms of reflow, temperature cycle loads, drop test, etc.).

Furthermore, it is advantageously possible that the electronic component can be approached very closely up to the surface of the copper foil or other carrier substrate so that for instance one or more sensors as electronic component can be exposed to a surface. It is furthermore possible that an at least partial exposure of the copper can be used for a partial registration of the electronic component. Thus, a high degree of accuracy for the subsequent procedures may be obtained.

According to the described embodiment, it is possible to embed both relatively large (for instance larger than 4 $mm^2$) and small (for instance smaller than 4×4 $mm^2$) electronic components in a circuit board. Furthermore, it is possible to manufacture flexible arrangements, adapted to constituents with different thicknesses.

Hence, according to the described embodiment, a low viscose sticky solution of epoxy-based resin can be used for a full-surface coating of a copper foil for the placement of components for the manufacture of printed circuit boards with embedded electronic components. Preferably, the solution of epoxy-based resin may be selected with a very similar composition as the surrounding prepreg and can therefore have basically the same properties.

The starting point of the manufacturing procedure described in the following referring to FIG. 9 to FIG. 13 is a carrier structure 100 which is configured as a multi-layer substrate.

Figure 9:
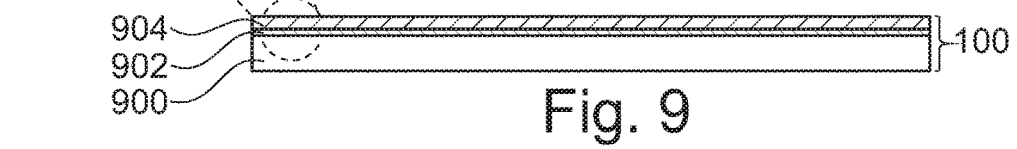
FIG. 9, FIG. 10, FIG. 11, FIG. 12 and FIG. 13 illustrate different structures obtained during carrying out a method of manufacturing a circuit board intermediate structure (see FIG. 11) and a circuit board (see FIG. 13) according to another exemplary embodiment of the invention.

The carrier structure 100 shown in FIG. 9 is formed of a support layer 900 (for instance a 100 μm thick copper layer) which is separated from an electrically conductive layer 904 (for instance a 2 μm thick copper layer) by an intermediate separation layer 902. Although not shown in FIG. 9 and although optional, the carrier structure 100 may be made subject to a surface activation procedure, as described above referring to FIG. 2 in order to improve the capability of forming a homogeneous layer of adhesive 300 (compare FIG. 10) on the top surface of the carrier structure 100.

Figure 10:
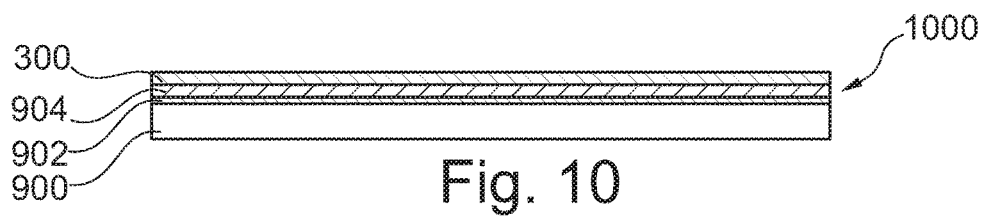

FIG. 10 shows a structure 1000 obtained after applying a continuous (for instance 20 μm thick) full surface layer of flowable low viscosity adhesive 300, embodied as liquid resin-based adhesive, on the carrier structure 100 in a similar way as described above referring to FIG. 3. More generally, a thickness of the layer of adhesive 300 when applied on the carrier structure 100 may be in a range between 10 μm to 40 μm, in particular in a range between 15 μm and 25 μm.

Figure 11:
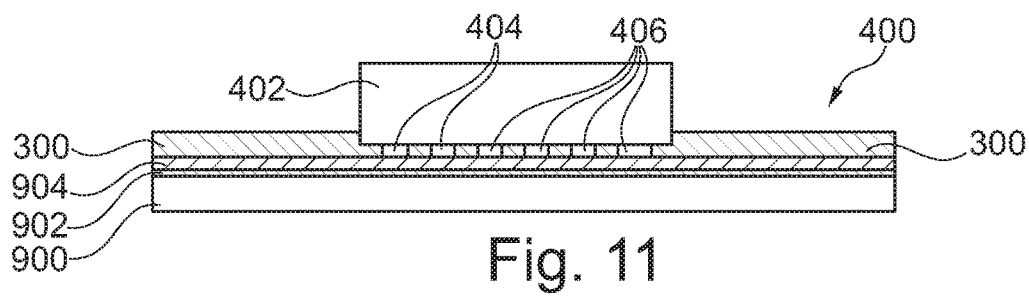

Then, an electronic component 402 is pressed into the liquid sticky layer of adhesive 300 so that the contact pads 406 contact the upper surface of the electrically conductive layer 904 to thereby obtain the circuit board intermediate product 400 shown in FIG. 11.

Figure 12:
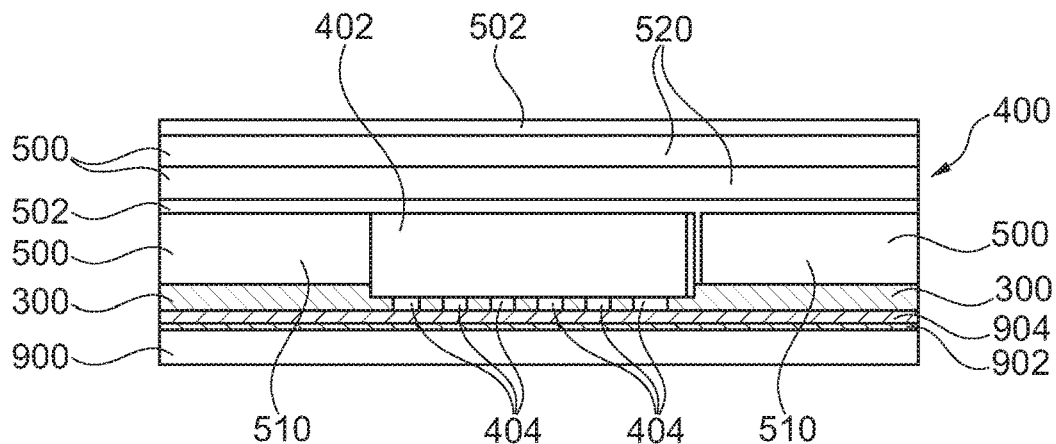

A further processed circuit board intermediate product 400 shown in FIG. 12 is obtained by attaching three electrically insulating structures 500 and two layers of electrically conductive material 502 on the arrangement of FIG. 11, in a similar way as described above referring to FIG. 5.

Figure 13:
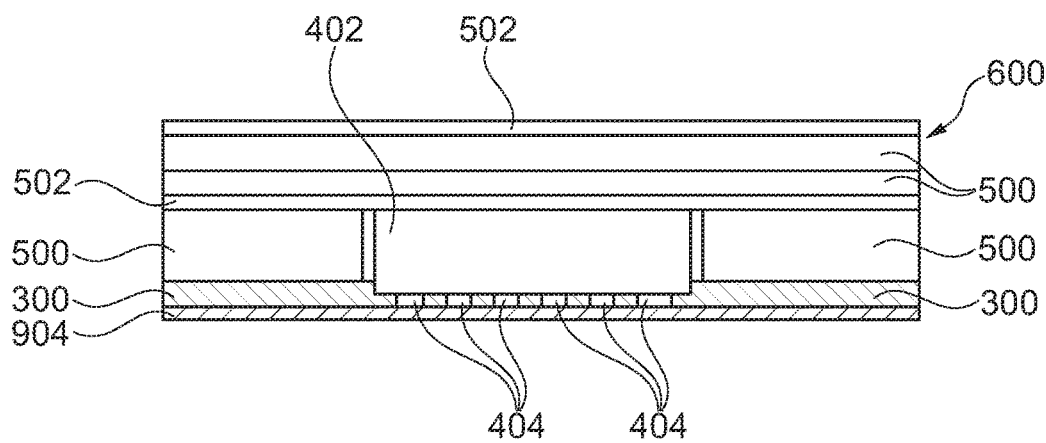

After having compressed the circuit board intermediate product 400 shown in FIG. 12 to obtain an interference fit assembly, the support layer 904 may be peeled off from the rest at the separation layer 902. Therefore, the thin electrically conductive layer 900 remains part of the formed circuit board 600, as shown in FIG. 13. Thanks to the support layer 904, handling of very thin layers can be avoided, and nevertheless a very thin electrically conductive layer 900 may be provided for fulfilling electric contact tasks in the circuit board 600 without the need of a separate wiring formation procedure.

Figure 14:
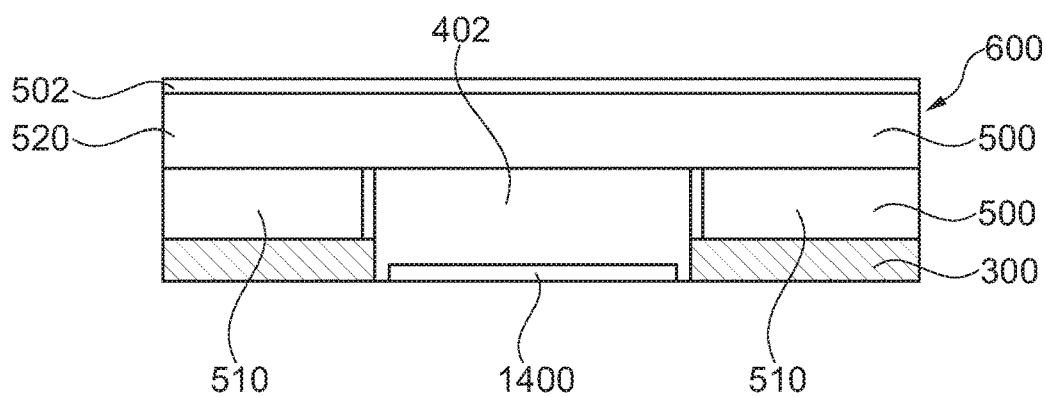
FIG. 14 illustrates a circuit board according to yet another exemplary embodiment of the invention which differs from the circuit board shown in FIG. 6 in that it implements an electronic component having a sensor active surface exposed at an exterior surface of the circuit board.

FIG. 14 illustrates a circuit board 600 according to yet another exemplary embodiment of the invention which differs from the circuit board 600 shown in FIG. 6 in that it implements an electronic component 402 having a sensor active surface 1400 exposed at an exterior surface of the circuit board 600. The circuit board 600 according to FIG. 14 can be manufactured basically using the same procedure as described above referring to FIG. 1 to FIG. 6 with the difference that the surface of the electronic component 402 having the contact pads 406 is replaced by the sensor active surface 1400. In particular, referring to FIG. 4, the sensor active surface 1400 is immersed within the liquid sticky adhesive 300 so as to advance or press forward the sensor active surface 1400 up to or almost up to the surface of the carrier structure 100 which is covered with the layer of adhesive 300. This has the advantage that, after having removed the carrier structure 100 from the rest of the arrangement, the sensor active surface 1400 is already exposed to the surface or is only covered by a very thin layer of the adhesive 300 material which can be easily removed, for instance by applying a cleaning procedure. During operation of the circuit board 600, the sensor active surface 1400 is in direct functional interaction with the surrounding environment and can therefore fulfil its sensing capability with high precision. For instance, the sensor active surface 1400 may be sensitive with regard to a surrounding gas atmosphere, surrounding light conditions, etc. The sensor active surface 1400 may hence be capable of generating a signal indicative of a condition to be sensed in an environment.

Further alternatively, the printed circuit board 600 shown in FIG. 14 may also be manufactured using a manufacturing procedure as described above referring to FIG. 9 to FIG. 13. After having obtained a structure as shown in FIG. 13, the sensor active surface 1400 can be exposed to the surrounding environment, for instance by applying a lithography and etching procedure.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A method of manufacturing a circuit board intermediate product, wherein the method comprises:
    providing a carrier structure;
    applying a layer of flowable adhesive on the carrier structure over a surface area of the carrier structure which is larger than a mounting area in which an electronic component is to be mounted on the carrier structure, wherein the mounting area equals to a lower main surface of the electronic component;
    pressing the electronic component into a subsection of the layer of adhesive in the mounting area thereby immersing at least part of the electronic component within the adhesive; and
    removing the carrier structure after solidifying the adhesive.

2. The method according to claim 1, wherein the surface area covered by the layer of adhesive is at least two times of the mounting surface of the electronic component.

3. The method according to claim 1, the electronic component being one of the group consisting of a semiconductor chip, a frequency filter, a voltage converter, a memory, a capacitor, an inductance, a cryptographic component, and a sensor.

4. The method according to claim 1, wherein a viscosity of the adhesive when applied on the carrier structure is in a range between 1000 mPa·s and 50000 mPa·s at 25° C.

5. The method according to claim 4, wherein removing the carrier structure comprises peeling off the carrier structure after solidifying the adhesive.

6. The method according to claim 1, wherein the method further comprises solidifying or curing the adhesive after having pressed the electronic component in the mounting area.

7. The method according to claim 1, wherein the method further comprises at least partially exposing the part of the electronic component immersed within the adhesive by removing remaining material of the layer of adhesive covering the immersed part of the electronic component after removing at least part of the carrier structure.

8. The method according to claim 7, wherein the method further comprises forming electrically conductive material on the at least partially exposed part of the electronic component.

9. The method according to claim 1, wherein the method further comprises forming an electrically insulating structure on the adhesive and the electronic component.

10. The method according to claim 9, wherein the method further comprises forming at least one electrically conductive structure on the electrically insulating structure and/or forming at least one electrically conductive structure in the electrically insulating structure.

11. The method according to claim 1, wherein said pressing includes pressing the electronic component into the adhesive so that at least one contact pad of the electronic component is immersed within the adhesive.

12. The method according to claim 1, wherein said pressing includes pressing the electronic component into the adhesive so that at least one sensor active surface of the electronic component is immersed within the adhesive.

13. The method according to claim 1, wherein the carrier structure is a foil.

14. The method according to claim 13, wherein the method further comprises subjecting the surface area of the foil on which the adhesive is to be applied to a surface activating procedure prior to applying the adhesive on the surface area.

15. The method according to claim 13, wherein the method further comprises removing the entire foil after solidifying the adhesive.

16. The method according to claim 13, wherein a thickness of the foil is in a range between 50 µm and 500 µm.

17. The method according to claim 13, wherein the carrier structure is a paper foil.

18. A method of manufacturing a circuit board, comprising:
providing a carrier structure;
applying a layer of flowable adhesive on the carrier structure over a surface area of the carrier structure which is larger than a mounting area in which an electronic component is to be mounted on the carrier structure, wherein the mounting area equals to a lower main surface of the electronic component;
pressing the electronic component into a subsection of the layer of adhesive in the mounting area thereby immersing at least part of the electronic component within the adhesive; and
removing the carrier structure after solidifying the adhesive.

* * * * *